United States Patent [19]

Nicolau

[11] 4,347,230

[45] Aug. 31, 1982

[54] PROCESS FOR THE PREPARATION OF ALPHA MERCURIC IODIDE MONOCRYSTALS

[75] Inventor: Ion F. Nicolau, Seyssins, France

[73] Assignee: Commissariat a l'Energie Atomique, Paris, France

[21] Appl. No.: 161,923

[22] Filed: Jun. 23, 1980

[30] Foreign Application Priority Data

Jun. 26, 1979 [FR] France .................. 79 16418

[51] Int. Cl.³ .................. C30B 29/12
[52] U.S. Cl. .................. 423/491; 156/621; 156/DIG. 82; 156/DIG. 98
[58] Field of Search ....... 196/621, DIG. 82, DIG. 98; 423/491, 101, 103; 210/914, 748

[56] References Cited

U.S. PATENT DOCUMENTS 3,969,182 7/1976 Carlston .................. 156/621

OTHER PUBLICATIONS

Growth of Crystals From Liquids-Brice North Holland, N.Y., 1973, p. 83.
Fundamentals of Crystal Growth I-Rosenberger, Springer-Verlag, N.Y., 1979, pp. 395, 251.
Crystal Growth, Pamplin-Ed. Pergamon Press, N.Y., 1975, pp. 300-302.
Journal of Crystal Growth, 24/25 (1974), 205-211, Oct. 1974, Schieber et al.

*Primary Examiner*—Hiram Bernstein
*Attorney, Agent, or Firm*—Kerkam, Stowell, Kondracki & Clarke

[57] ABSTRACT

Process for the preparation of alpha mercuric iodide monocrystals by growth in solution, wherein an alpha mercuric iodide solution in an organic sulphoxide is used and wherein growth is brought about on a nucleus located in a cavity able to block the growth defects of the monocrystal.

The invention also relates to the alpha mercuric iodide monocrystals with octahedral-pinacoid habits obtained.

13 Claims, 3 Drawing Figures

ELECTROLYTIC PURIFICATION

ELECTROLYTIC PURIFICATION

CRYSTAL GROWTH

PROCESS FOR THE PREPARATION OF ALPHA MERCURIC IODIDE MONOCRYSTALS

BACKGROUND OF THE INVENTION

The present invention relates to a process for the preparation of alpha mercuric iodide monocrystals ($\alpha$-$HgI_2$).

Hitherto, various methods have been used to attempt to attain alpha mercuric iodide monocrystals having an adequate crystalline quality for purity. These methods have in particular consisted of growth in solution and growths in the vapour phase. On the basis of the vapour phase, a known process consists of growing a $\alpha$-$HgI_2$ monocrystal at the end of a sealed quartz tube by mass transfer in vacuo from an annular $\alpha$-$HgI_2$ polycrystalline source placed in the other end of the tube. The temperature of the crystal is kept constant, for example at 100° C., whilst the temperature of the source varies between 1° and 2° C. and 98° C.

This process makes it possible to obtain $\alpha$-$HgI_2$ monocrystals of up to 30 g within 3 to 12 days. On the basis of crystals obtained according to this process, high-performance X and $\gamma$-detectors have been produced having a product $\mu_e \tau_e$ of the order of $10^{-4} cm^2/V$ and a product $\mu_h \tau_h$ of the order of $10^{-6} cm^2/V$. In this case, $\tau$ designates the mobility of the charge carriers and $\mu$ the life for electrons with index e and for holes with index h. However, this process has a number of disadvantages.

The main disadvantage is linked with its operating principle in which growth periods follow etching periods. As a result, the crystal is marked by growth rings where are concentrated growth defects and impurities.

Another major disadvantage is the stoichiometry of the crystal which cannot be controlled during growth. Crystals growing from high purity polycrystals only grow with difficulty having a prismatic-pinacoid habit and being rich in mercury. The crystals develop by advancement of the faces (110) of the prism which easily trap impurities (mercury in excess counts as an impurity) and growth defects are propagated throughout the crystal mass. The addition of iodine during the growth blocks the faces which can be no longer making the monocrystal grow.

Moreover, the crystal grows from a nucleus obtained by spontaneous nucleation, i.e. at the start of growth the nucleus which is to be grown is selected from a number of nuclei. However, in the case of spontaneous nucleation, it is not possible to control the orientation of the crystal relative to the tube and as the nucleus is never perfect, it still produces defects which are propagated in the crystal mass. At the end of growth, the crystal obtained is cooled to ambient temperature, so that it undergoes supplementary deformations.

Thus, this preparation process does not make it possible to systematically obtain satisfactory monocrystals. It is not reproducible and the crystals are never completely usable. After growth, it is necessary to cut off the good parts, which only represent $\frac{3}{4}$ of the crystal volume. The density of the dislocations is approximately $10^4$–$10^7 cm^{-2}$.

An $\alpha$-$HgI_2$ purification process is also known involving fusion of the zones and successive sublimations. This process makes it possible to obtain high purity $\alpha$-$HgI_2$, but it is extremely laborious to perform and gives a relatively low yield. Thus, to achieve high purity, 30 to 100 fusions of zones and 6 to 30 successive sublimations are necessary. Only one process gives satisfactory results and this forms the subject matter of French Application No. 76 02 031 filed on Jan. 26th 1976 by the Commissariat a l'-Energie Atomique.

This known process for the preparation of alpha mercuric iodide monocrystals consists of dissolving alpha mercuric iodide and at least one dialkyl sulphoxide in an organic solvent, the molar ratio of the dialkyl sulphoxide to the solvent being between 0.01 and 0.1 mol of dialkyl sulphoxide per mol of solvent and the molar ratio of alpha mercuric iodide to dialkyl sulphoxide being between 0.5 and 0.6 mol of alpha mercuric iodide per mol of dialkyl sulphoxide. Alpha mercuric iodide monocrystals are then grown from this solution.

The dialkyl sulphoxides used are selected from the group including dimethyl sulphoxide, methyl ethyl sulphoxide and diethyl sulphoxide, preference being given to dimethyl sulphoxide (DMSO).

The organic solvents used are moderately polar saturated aliphatic solvents which are stable in the presence of mercuric iodide and in particular esters resulting from the esterification of acetic acid by saturated aliphatic alcohols, such as methyl acetate, ethyl acetate, propyl acetate and butyl acetate, saturated aliphatic monoketones such as acetone, methyl ethyl ketone, diethyl ketone and dipropyl ketone and saturated aliphatic nitro derivatives such as nitroethane and nitropropane. The alpha mercuric iodide monocrystals are grown by lowering the temperature of the solution, by evaporating the solvent or by circulating the solution between a container containing the mercuric iodide polycrystals and a container containing monocrystalline nuclei of alpha mercuric iodide. The alpha mercuric iodide forming the starting substance is synthesised from 5 N iodine and 7 N mercury dissolved in a mixture of dimethyl sulphoxide and ethyl acetate and further purified by successive recrystallization processes using solutions of the same composition.

Although this process is highly satisfactory it still has three disadvantages. Firstly, the alpha mercuric iodide monocrystals obtained have a significant deviation compared with the exact stoichiometric composition due to mercury enrichment. The second disadvantage is that alpha mercuric iodide monocrystals are obtained with a prismatic-pinacoid habit, so that the crystals obtained have certain imperfections due to edge dislocations and stack defects in the growth sectors corresponding to the advance of the faces (110). The third disadvantage results from the fact that alpha mercuric iodide solutions become impure during synthesis, purification and growth due to the dissolving of impurities from the borosilicate glass used for all the containers receiving the solutions.

All these imperfections linked with the deviation relative to the stoichiometry, the dislocations and the impurities are disadvantageous for certain applications of alpha mercuric iodide monocrystals and in particular their use in detectors and X and gamma radiation spectrometers.

The process according to the invention obviates the disadvantages referred to hereinbefore and in particular makes it possible to obtain alpha mercuric iodide monocrystals having an octahedralpinacoid habit, thus eliminating the edge and/or screw dislocations and the stacking defects in the nucleus due to the advance of the octahedral faces (011).

Another process for the preparation of alpha mercuric iodide monocrystals is known in U.S. Pat. No. 3,969,182 which uses DMSO as the solvent or more correctly as the complexing agent. In this process, $HgI_2$ is dissolved in DMSO at saturation between 20° and 80° C., for example in accordance with the molar ratio of $HgI_2$:DMSO of approximately 0.5, the solution is filtered on a fritted glass filter and then the glass container containing the solution is left open in contact with moist air with a 15 to 50% humidity level in order to crystallize for 0.5 to 24 hours. The moisture reduces the solubility of $HgI_2$ which crystallizes by spontaneous nucleation on the bottom of the container. Crystals of $10^{-2}$ are obtained after 7.5 cm$^3$. It is also possible to dilute DMSO with xylene or toluene until a saturated $HgI_2$ solution is obtained with a molar ratio of $HgI_2$:DMSO of 0.33, followed by the crystallization of alpha-$HgI_2$ by moisture absorption in the manner described hereinbefore. This process is unsuitable for practical requirements. The crystals develop faces of the prism (110) and are very distorted. As a result of their crystalline quality and impurities the monocrystals obtained are not usable for nuclear detection. They are characterised by a product $\mu_e \tau_e = 4 \times 10^{-8}$ cm$^2$/V and $\mu_h \tau_h$ which is not measurable ($\mu$ being the mobility of the charge carriers and $\tau$ their life, as hereinbefore). Thus, it is not possible to obtain monocrystals of $\alpha$-$HgI_2$ without inclusions of DMSO and water from $HgI_2$ saturated solutions in purity DMSO and the inclusions are highly prejudicial to the quality of the crystals because they make the product $\mu\tau$ of the electrons ($\mu_e\tau_e$) low and that of the holes ($\mu_h\tau_h$) extremely low.

The dilution of DMSO by xylene or toluene makes the $HgI_2$ monocrystals increasingly unusable as $HgI_2$ reacts with the aromatic solvents. Organo-metallic compounds are produced which are added to the impurities absorbed by the solution from the glass of the container and in particular fritted glass at the time of filtering.

For all these reasons, the crystals obtained by this process have the disadvantage of not being stoichiometric, mercury being in excess, and they contain a very high level of edge and screw dislocations of approximately $10^4$–$10^5$ cm$^{-2}$.

BRIEF SUMMARY OF THE INVENTION

Unlike all the prior art processes, the invention makes it possible by means of a particularly simple process which is easy to perform, to obtain with a very good yield alpha mercuric iodide monocrystals improved as regards their purity, structure and properties for use as elements of radiation detectors. According to the invention, this is obtained by adopting in a process by growth in solution different measures essentially consisting of aiding the growth in the form of a monocrystal with octahedral-pinacoid habits.

The invention relates to a process for the preparation of alpha mercuric iodide monocrystals by growth in solution in which an alpha mercuric iodide solution is used in an organic sulphoxide, preferably mixed with an alcohol such as methanol and in the presence of an iodine excess, whereby said solution is preferably purified beforehand by electrolysis and the monocrystalline nucleus is preferably placed in a cavity able to block growth defects of the monocrystal.

The starting solution can advantageously be an alpha mercuric iodide solution in a mixture of dimethyl sulphoxide and water-free methanol in which the molar fraction of the dimethyl sulphoxide $$\frac{(DMSO)}{(DMSO) + (MeOH)}$$

is between 0.6 and 0.9, the solution being saturated at 25° C. with an alpha mercuric iodide molar ratio $(H_gI_2)/(DMSO)+(MeOH)$ between 0.2 and 0.4. Preference is given to a solution containing an iodine excess with a molar ratio $(I_2)/(HgI_2)$ between $10^{-4}$ and $10^{-2}$. On the basis of such a solution, the growth of the monocrystals can advantageously take place at a temperature between 25° and 40° C. in moisture-proof, tightly sealed containers. Optionally, the dimethyl sulphoxide can be replaced by another organic sulphoxide such as methyl ethyl sulphoxide, diethyl sulphoxide or tetramethylene sulphoxide. In the crystals obtained, the octahedral-pinacoid habit results on the one hand from slowing down the growth rate of the faces (011) of the octahedron by a greater adsorption of the $HgI_2$ complexes (DMSO)$_2$ on the faces as a result of the increase in the DMSO content of the growth bath compared with the previously used growth baths and on the other hand the normal growth rate of the face (110) of the prism, which is no longer slowed down either by a mercurous iodide excess or by a high impurity level.

The cavity in which the nucleus is placed is provided in a nucleus carrier which is advantageously made from quartz or a plastics material constituted by polyolefins or fluorinated polyolefins and in particular polyethylene, polypropylene and polytetrafluoroethylene. The nucleus carrier is generally a plate with a dovetailed prismatic cavity at the bottom of which rests by one face (100) a monocrystalline nucleus cut in a prismatic shape and whose axis is in direction (001). More specifically, it is desirable to use a straight prismatic nucleus with an isosceles triangle cross-section, laterally limited by one face (100) and two symmetrical faces (110) and terminated at the ends by two faces (001). The cavity of the corresponding nucleus carrier is advantageously prismatic with a rectangular cross-section and is terminated by planar faces which, at the ends of the nucleus, are inclined and move together above it towards the open face of the cavity by which the nucleus is positioned.

In the growths of a monocrystal with octahedral habits, which can already be greatly assisted by the selected growth medium, this nucleus carrier has the effect of mechanically preventing the propagation of dislocations due to the nucleus, which are also refracted between the unstable initial faces (110) of the nucleus and the forming stable octahedral faces (011).

Finally, all the dislocations are either stopped on the inner walls of the cavity or are eliminated on the faces of the pinacoid, thus making it possible to obtain highly perfect crystalline monocrystals. The quantity of screw and/or edge dislocations emerging on the faces of the pinacoid does not generally exceed 10 cm$^{-1}$. However, in the growth conditions referred to hereinbefore, in order to obtain the octahedral-pinacoid habit by completely eliminating the faces of the prism (110) it is useful to have a very pure solution. It is therefore of interest to purify by electrolysis the mercuric iodide solution in accordance with the molar proportions referred to hereinbefore in such a way that a conductivity of at least 100 $\mu$S cm$^{-1}$ at 20° C. is obtained.

The high purity obtained in this way is due to the fact that the mercuric iodide in organic sulphoxide such as dimethyl sulphoxide and its homologs is in the form of a non-ionized complex of the HgI$_2$ (DMSO)$_2$ type, whilst most of the impurities which are found in mercuric iodide, iodine or mercury in the case of so-called, high purity, commercial products are iodides which easily ionize in solution by complexing with mercuric iodide and sulphoxide.

BRIEF DESCRIPTION OF THE DRAWINGS

A non-limitative embodiment of the invention will now be described relative to FIGS. 1 to 3 in which alpha mercuric iodide monocrystals are produced by growth in solution in a medium of dimethyl sulphoxide and methanol on the basis of a solution which is previously purified by electrolysis. In the drawings show.

DETAILED DESCRIPTION OF THE PREFERRED EMBODIMENTS

The principle of the purification of the growth bath by electrolysis consists of placing the alpha mercuric iodide solution in a sulphoxide at ambient temperature in a quartz apparatus for semiconductors forming an anode space and a cathode space, which communicate with one another, but are separated by a fritted quartz membrane. Each contains a pure spectral graphite electrode and a voltage of approximately 100 to 300 V is applied thereto. The mercurous iodide mud and the impurity-concentrated solution are successively removed from the cathode space until a high purity solution is obtained in the anode space which is larger than the cathode space.

In the present case, 10 liters of commercial alpha mercuric iodide solution saturated at 25° C. are prepared in a mixture of DMSO—methanol of molar fraction $$\frac{(DMSO)}{(DMSO) + (MEOH)} = 0.8$$

Figure 1:
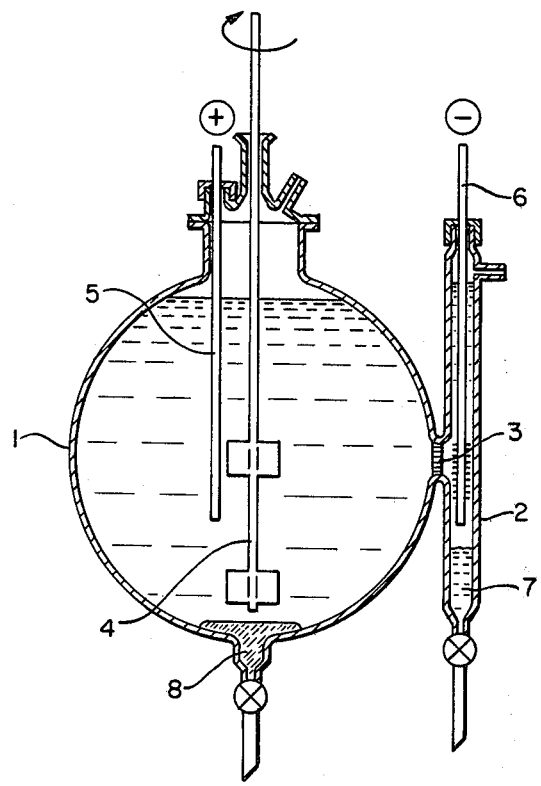
FIG. 1 diagrammatically, an apparatus used for purification by electrolysis.

(of density $d_{20}^4 = 2.425$) by dissolving 17.090 g of alpha mercuric iodide in 5.900 ml of DMSO diluted with 840 ml of MeOH in a quartz round-bottomed flask for semiconductors. The methanol is a product rectified in a column of conductivity 0.16 μS cm$^{-1}$, DMSO being a dried commercial product used without supplementary purification and of conductive 0.30 μS cm$^{-1}$. This flask 1, according to FIG. 1, constitutes the anode space of the electrolyzer and is provided with a quartz stirrer 4 and a pure spectral graphite anode 5.

The cathode space is constituted by a quartz tube 2 of volume 100 ml containing the pure spectral graphite cathode 6. The two spaces are welded and are interconnected by means of a fritted quartz plate 3 forming a membrane.

The thus prepared solution has a conductivity dependent on the purity of the mercuric iodide used and can be in the range 100 to 400 μS cm$^{-1}$. As a function of the conductivity of the solution, a voltage is applied to the electrodes which can be between 50 and 100 V. The power which can be dissipated within the solution is limited or the solution is cooled in such a way that it does not heat to above 25° C. The acceptable currents are approximately 20 to 100 mA.

The electric current is carried by the iodomercurate anions (HgI$_3$)$^-$, the cations of impurities and to a certain extent the cations (HgI)$^+$. All these ions are obtained either from the complexing of the iodides of impurities by mercuric iodide according to a general reaction of the following type for sodium iodide for example:

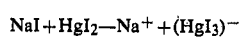

NaI + HgI$_2 \rightarrow$ Na$^+$ + (HgI$_3$)$^-$ or a certain auto-complexing of the mercuric iodide itself according to the reaction:

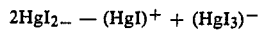

2HgI$_2 \rightarrow$ (HgI)$^+$ + (HgI$_3$)$^-$

At the anode, the iodomercurate anions discharge and supply the iodine. To obviate the iodine concentration, a 7 N high purity mercury excess (8) can be placed at the bottom of the round-bottomed flask and this reacts with the iodine, re-forming mercuric iodide. In this case, the solution is diluted every so often to prevent supersaturation.

At the cathode, the cations of impurities are concentrated in the cathode space, for example Na$^+$, K$^+$, Fe$^{3+}$, Ni$^{2+}$, Cu$^{2+}$, Cu$^+$, Cr$^{3+}$, Ca$^{2+}$, Ag$^+$ etc. The cations (HgI)$^+$ are discharged and deposit an insoluble mercurous iodide mud (7). Certain impurity cations are deposited at the same time as the mercurous iodide mud or are adsorbed in this mud. The conductivity of the cathode space increases by one or even two orders of magnitude by the concentration of the ionized impurities. The space is emptied under voltage and electrolysis is continued. The conductivity of the anode space decreases progressively as a result of the purification and remains stationary at 110 μS cm$^{-1}$ at 20° C., which is an approximate value being dependent not only on the auto-ionization of the mercuric iodide, but also on the presence of a certain level of other ionized mercury salts accompanying the mercuric iodide as impurities, for example other halides, nitrate, sulphate, cyanide, etc.

Purification is continued until the conductivity of the cathode space increases no further or only increases very slowly. The solution is then purified of cations of impurities, the purity reaching 6–7 N. A supplementary purification can be carried out to also eliminate the anions of impurities, whereby the same procedure is used, but the polarity is reversed. The starting products can be commercial 5 N mercuric iodide of 5 N iodine and commercial 7 N mercury, which are reacted in solution in stoichiometric quantities. The electrolytic purification process is simplified, but still remains necessary. The solution is filtered on a funnel with a fritted quartz filter plate in order to eliminate graphite particles coming from the electrodes.

Part of the solution is used as the growth bath and another part is used for recovering solid mercuric iodide. In order to obtain solid mercuric iodide, the mercuric iodide is precipitated with ultra-pure water of conductivity 0.1 μS cm$^{-1}$. Filtration takes place on a funnel with a fritted quartz filter plate, followed by drying the precipitate in vacuo at 60° C. The excess iodine resulting from the electrolysis process is evaporated in vacuo. From one liter of solution, 1700 g of 7 N mercuric iodide are recovered. The total yield of the electrolytic purification process is dependent on the purity of the initial mercuric iodide, but it still remains high, approximately 80 to 90%.

This growth bath used in the present embodiment is a solution purified by electrolysis in the manner described hereinbefore, saturated at 25° C. in alpha mercuric iodide in a mixture of dimethyl sulphoxide and methanol, to which is also added an iodine excess. For a molar fraction of DMSO in the mixture between 0.6 and 0.8, the mercuric iodide molar fraction in the solution is between 0.22 and 0.36. Iodine is added until a molar ratio $(I_2)/(HgI_2)$ is obtained of approximately $10^{-2}$ to $10^{-4}$. Alpha mercuric iodide monocrystals are grown from this solution at between 25° and 40° C., using conventional procedures for growth in solution either by lowering the temperature of the solution, or by dilution with methanol, or by recirculation of the solution.

In the present case, the solution recirculation method is used, consisting of using two interconnected containers, one of them containing the polycrystals to be dissolved and the other the nuclei to be grown. The dissolving container is kept at a temperature above that of the growth container and the solution is continuously circulated from one container to the other. Thus, as a function of the temperature difference between the containers and the dissolving rate, a stationary mass transfer takes place which produces a particular growth rate of the monocrystals.

Figure 2:
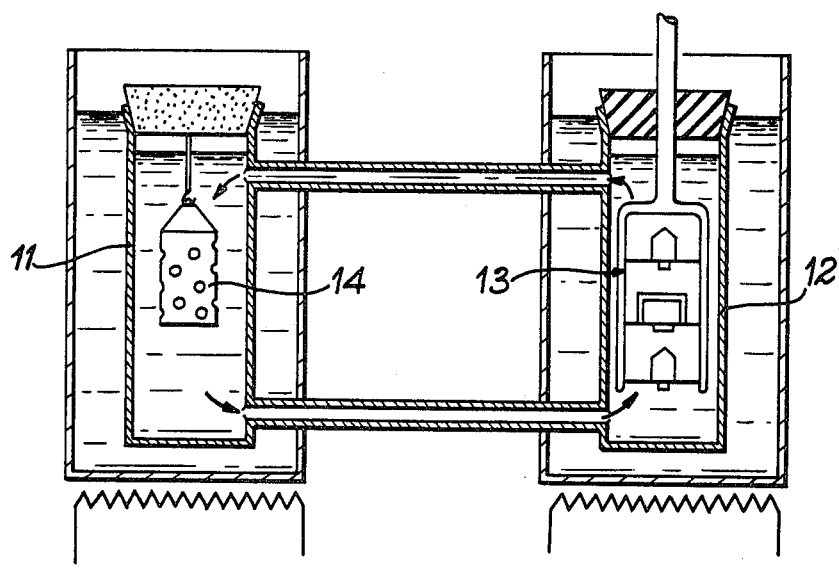
FIG. 2 diagrammatically, the apparatus for growth in solution.

The process is performed in the apparatus diagrammatically shown in FIG. 2. This apparatus comprises two containers 11 and 12 made from quartz or semiconductors which are linked with one another. The dissolving container 11 contains alpha mercuric iodide polycrystals purified by electrolysis in a perforated polytetrafluoroethylene beaker 14.

An alpha mercuric iodide saturated solution purified by electrolysis at 25° C. is prepared in the DMSO—MeOH mixture of molar fraction (DMSO)/(DMSO)+(MeOH)=0.8. A $10^{-3}$ ultra-pure iodine excess relative to the mercuric iodide is added and the two containers are filled with this solution. A quartz stirrer is fitted in the growth container and the growth thermostat temperature is raised for example to 40° C. and the dissolving thermostat temperature to 35° C. After 48 hours, the solution circulating between the two containers by thermal convection becomes saturated with alpha mercuric iodide at 35° C.

Figure 3:
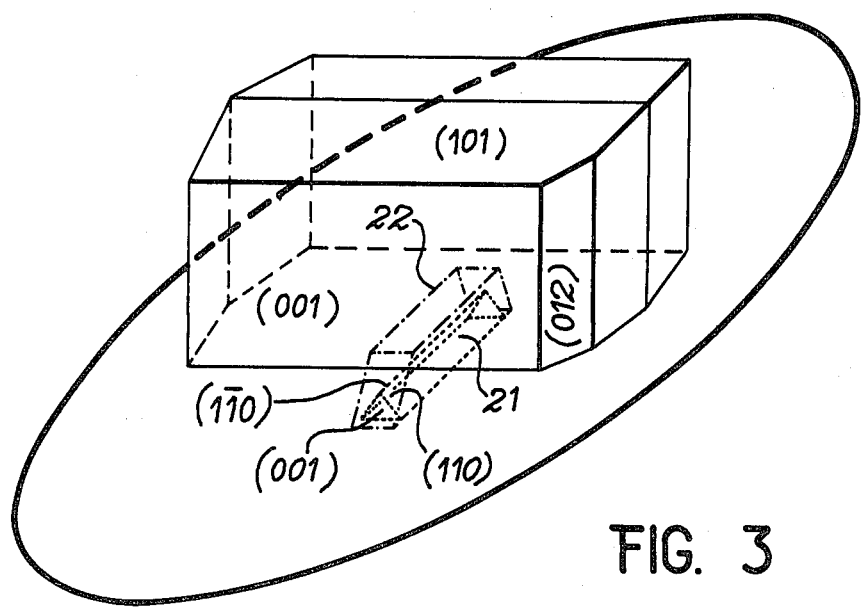
FIG. 3 the size of the nucleus and its arrangement in a nucleus carrier.

The stirrer is removed from the growth container and a quartz stirring shaft 13 having one or more polytetrafluoroethylene nucleus carriers according to FIG. 3 containing nuclei placed in the cavities of the nucleus carrier plates is introduced. The cavities of the plates are prismatic and have a dovetail shape. The nuclei are cut with a wet wire saw from large monocrystals having a good crystalline quality and have a prismatic shape.

According to FIG. 3, which shows the different planes, each crystal 21 is cut in the form of a straight prism with an isosceles triangular section in order to have between the end bases constituted by faces (001), two rectangular side faces constituted by faces (110) and one rectangular side face constituted by a face (100) with a length of at least 10 mm along direction (001). The nucleus rests on face (100) at the bottom of cavity 22. The latter is prismatic with a rectangular section over a width substantially corresponding to that of the face (100) of the nucleus. It is terminated by two planar faces inclined relative to one another over the nucleus, thus giving the dovetail shape.

The temperature of the crystallization container is raised, for example to 32° C. and the dissolving container temperature is left unchanged.

The alpha mercuric iodide mass transfer takes place between the two containers by convection. The stirring shaft 13 rotates at 60 r.p.m. with a rotation direction change every 30 seconds. Growth takes place at a rate of approximately 0.5 mm per day and reaches a volume of 36 to 73 cm$^3$ after 2 to 3 months.

At the end of 2 to 3 months, one or more alpha mercuric iodide monocrystals are obtained of length 60 to 70 mm, thickness 20 to 30 mm and height 30 to 35 mm, weighing between 225 to 475 g with an octahedral-pinacoid habit. The crystal removed from the growth bath after removing the solution and allowing the growth container to progressively cool to ambient temperature.

The alpha mercuric iodide monocrystals obtained in this way are completely transparent, free from solution inclusions, stacking defects, grain boundaries, internal tensions and deformations. The degree of dislocations remains approximately 10 cm$^{-2}$ and the purity is approximately 6 to 7 N. The main residual impurity is silicon.

The alpha mercuric iodide monocrystals obtained by the process of the invention can be used for producing detectors and spectrometers of X and gamma radiation and have the advantage of improving the performance levels of said detectors and spectrometers compared with the crystals obtained in accordance with the prior art. For these uses, they in particular have the following characteristics for the product mobility x life of the charge carriers:

electrons: $3 \times 10^{-4} \geq {_e}\mu_e \tau 5.10^{-5}$ cm$^2$/V.

holes: $5 \times 10^{-6} \geq {_h}\mu_h 5.10^{-7}$ cm$^2$/V.

However, the invention is not limited to the features described with respect to the embodiment.

What is claimed is:

1. A process for the growth of alpha mercuric iodide monocrystals in solution, comprising the steps of preparing an alpha mercuric iodide solution in an organic sulphoxide and causing growth on a nucleus located in a cavity able to block the growth defects of the monocrystal, the nucleus resting by one face on the bottom of a prismatic cavity having a rectangular cross-section made in a nucleus carrier in the direction of the nucleus.

2. A process for the growth of alpha mercuric iodide monocrystals in solution, comprising the steps of preparing an alpha mercuric iodide solution in dimethyl sulphoxide and mixing in the solution methanol of molar fraction in organic sulphoxide between 0.6 and 0.9 in the presence of an iodide excess.

3. A process according to claim 2, wherein the solution initially contains an iodine excess of $10^{-2}$ to $10^{-4}$ molar relative to the mercuric iodide.

4. A process according to claim 2, including the further step of maintaining the temperature of the solution at between 25° and 40° C.

5. A process for the growth of alpha mercuric iodide monocrystals in solution, comprising the steps of preparing an alpha mercuric iodide solution in an organic sulphoxide, adding to the solution methanol and purifying the methanol beforehand by electrolysis to eliminate the cations and/or anions from compounds more ionized than the mercuric iodide.

6. A process according to claim 1 including the further step of growing the monocrystals on a prismatic nucleus laterally limited by a face and two symmetrical faces.

7. A process according to claim 6, wherein the nucleus is terminated at the ends by two faces (001).

8. A process according to claim 8, wherein the cavity has dovetail shapes with end faces inclined so as to move towards one another above the nucleus.

9. A process according to claim 1, wherein there is a growth rate of approximately 0.5 mm per day.

10. Alpha mercuric iodide monocrystals with an octahedral-pinacoid habit obtained according to the process of claim 1.

11. A process for the growth of alpha mercuric iodide monocrystals in solution comprising the steps of preparing an alpha mercuric iodide solution in an organic sulfoxide, mixing methanol of molar fraction in organic sulfoxide between 0.6 and 0.9 in the solution, providing an iodide excess in the solution, prepurifying the methanol by electrolysis to eliminate the cations and/or anions from compounds more ionized than the mercuric iodide, and carrying out the electrolysis up to constant conductivity of less than 100 $\mu$S cm-1 at 20° C.

12. Alpha mercuric iodide moncrystals with an octahedral-pinacoid habit obtained according to the process of claim 2.

13. Alpha mercuric iodide monocrystals with an octahedral-pinacoid habit obtained by the process of claim 5.

* * * * *

UNITED STATES PATENT AND TRADEMARK OFFICE
CERTIFICATE OF CORRECTION

PATENT NO. : 4,347,230
DATED : August 31, 1982
INVENTOR(S) : Ion F. NICOLAU

It is certified that error appears in the above-identified patent and that said Letters Patent is hereby corrected as shown below:

Column 9, line 7, claim 8, "8" should be -- 7 --.

Signed and Sealed this

Twenty-second Day of March 1983

[SEAL]

Attest:

GERALD J. MOSSINGHOFF

Attesting Officer

Commissioner of Patents and Trademarks